United States Patent

Yamagishi et al.

[11] Patent Number: 5,785,758
[45] Date of Patent: Jul. 28, 1998

[54] SINGLE CRYSTAL GROWING APPARATUS

[76] Inventors: Hirotoshi Yamagishi; Kiyotaka Takano; Masanori Kimura, all of c/o Handotai Isobe Kenkyusho, Shin-Etsu Handotai Co., Ltd., 13-1 Isobe 2-chome, Annaka-shi, Gunma-ken, Japan

[21] Appl. No.: 777,670

[22] Filed: Dec. 20, 1996

[30] Foreign Application Priority Data

Dec. 26, 1995 [JP] Japan ................. 7-351367

[51] Int. Cl.⁶ ............................... C30B 35/00
[52] U.S. Cl. .................. 117/218; 117/200; 117/208; 117/900
[58] Field of Search ................ 117/200, 208, 117/218, 900

[56] References Cited

U.S. PATENT DOCUMENTS 4,650,540  3/1987  Stoll ............................. 117/218
4,784,715  11/1988  Stoll ............................. 117/218
5,551,978  9/1996  Akashi et al. ................ 117/208

FOREIGN PATENT DOCUMENTS 26 34 256  2/1978  Germany .................... 117/218

*Primary Examiner*—Felisa Garrett

[57] ABSTRACT

In a single crystal growing apparatus which pulls a semiconductor single crystal rod 14 from a semiconductor melt 13 contained in a quartz crucible 5 to grow the semiconductor single crystal, quartz crucible 5 is designed such that it can move up and down so as to maintain the level of semiconductor melt 13 constant and a main heater 7 which can move up and down and a subheater 10 which can move up and down are provided to heat semiconductor melt 13 so that the thermal environment of semiconductor melt 13 is maintained substantially constant.

3 Claims, 1 Drawing Sheet

SINGLE CRYSTAL GROWING APPARATUS

RELATED APPLICATION

This application claims the priority of Japanese Patent application No. 7-351367 filed on Dec. 26, 1995, which is incorporeted herein by reference.

BACKGROUND OF THE INVENTION

1. Field of the Invention

This invention relates in general to a single crystal growing apparatus for growing semiconductor single crystals by the Czochralski method, and more particularly to a single crystal growing apparatus for growing a semiconductor single crystal by pulling a semiconductor single crystal as a rod from a semiconductor melt obtained by melting polycrystalline semiconductor raw material.

2. The Prior Art

The Czochralski method is widely used for manufacturing semiconductor single crystals, particularly silicon single crystals. In this method, a seed crystal is dipped in a silicon melt contained in a quartz crucible and then pulled upwardly to grow a silicon single crystal.

A single crystal growing apparatus used in this method comprises a quartz crucible which contains the polycrystalline silicon raw material, a graphite crucible which holds the quartz crucible, a heater placed around the graphite crucible, a heat insulator, etc., all of which are housed in a chamber.

When growing a silicon single crystal using the single crystal growing apparatus, polycrystalline silicon raw material is put into the quartz crucible, and the graphite crucible is heated from the sides by the heater surrounding the graphite crucible. The polycrystalline silicon in the quartz crucible, heated not only from the sides by the heater through the graphite crucible and the quartz crucible but also from below by the radiation heat of the graphite crucible, melts and turns into a silicon melt. In this condition, a seed crystal hung from above is dipped in the silicon melt in the quartz crucible, and a silicon single crystal grows in a rod shape to provide a desired silicon single crystal as the seed crystal is pulled upwardly while being rotated.

In the single crystal growing process, the amount of the silicon melt in the quartz crucible decreases as the silicon single crystal grows and the level of the silicon melt gradually lowers. Lowering of the level of the silicon melt means a change in the height of the level and this changes the thermal environment, making it impossible to obtain a homogeneous silicon single crystal. Therefore, it is necessary to maintain the thermal environment approximately constant by keeping the height of the silicon melt constant. For this purpose, the quartz crucible and the graphite crucible are made as one unit which can move up-and-down so that the quartz crucible can go up so as not to change the level of the silicon melt due to the growth of the silicon single crystal rod.

In such a single crystal growing apparatus, since the quartz crucible is moved up along with the growth of the single crystal, the spatial relationship between the quartz crucible and the heater changes and sufficient heating may not be possible. Further, as described earlier, the heating from below the quartz crucible is simply by a radiation from below the graphite crucible and, when the diameter of the quartz crucible is large, the increase in the cross-sectional area weakens the heating from below. This can also cause insufficient heating.

In order to achieve uniform heating, there is proposed, a method (Japanese laid-open patent publication Tokkai Hei 3-5394) which uses a heater capable of up-and-down motions to maintain a constant spatial relationship for heating of the quartz crucible (graphite crucible) and a method (Japanese laid-open patent publication Tokkai Hei 2-192486) which places a fixed subheater under the quartz crucible in addition to the heater on the side of the quartz crucible (hereafter referred to as the "main heater") have been known, but they were not sufficient.

BRIEF SUMMARY OF THE INVENTION

The object of the present invention is to provide a single crystal growing apparatus which maintains a constant thermal environment for the semiconductor melt in the quartz crucible and provides a homogeneous semiconductor single crystal.

The invention in one aspect provides a single crystal pulling apparatus which pulls a semiconductor single crystal rod from a semiconductor melt contained in a quartz crucible to grow a semiconductor single crystal wherein said quartz crucible can move up and down so as to maintain the level of said semiconductor melt constant and a main heater which can move up and down and a subheater which can move up and down are provided to heat said semiconductor melt so that the thermal environment of said semiconductor melt is maintained substantially constant.

The invention in another aspect provides the above mentioned single crystal pulling apparatus wherein the up-and-down motion of the subheater is interlocked to the up-and-down motion of the quartz crucible or the up-and-down motion of the main heater.

DETAILED DESCRIPTION

Figure 1:
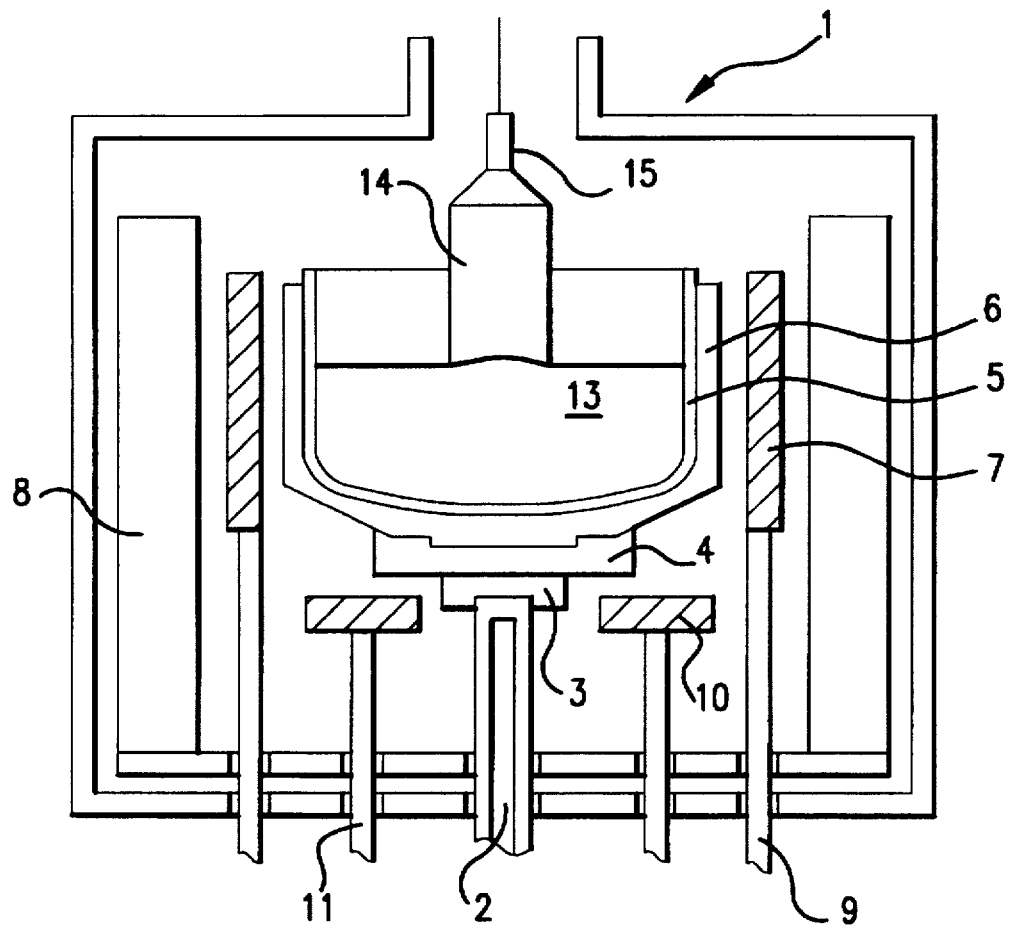
FIG. 1 is a vertical sectional view which shows a single crystal pulling apparatus according to an embodiment of the present invention.

The present invention is described in detail below.

The invention in one aspect of this patent application attempts to improve the problem of the fixed subheater being incapable of changing the spatial relationship between the main heater, the graphite crucible and the chamber by providing a mechanism which allows the subheater to move up and down. That is, the invention solves this problem by improving the fixed placement of the subheater, which has been a shortcoming of a conventional single crystal pulling apparatus, by means of, for example, making the subheater capable of moving up and down along with two electrodes.

The invention in another aspect is characterized by the addition of a mechanism to interlock the up-and-down motion of the subheater with the up-and-down motion of the quartz crucible. That is, the position of the quartz crucible itself is raised in a interlocked manner, for example by using a computer, so as to maintain a constant position of the surface of the silicon melt by compensating for the decrease of melt due to the growth of the single crystal during the pulling process of the single crystal. The present invention is characterized by the fact that the vertical position of the subheater is also moved based on a dynamic calculation to match the synchronized motion of the position of the quartz crucible.

Also, the up-and-down motion of the subheater can be interlocked not only to the movement of the quartz crucible but also to the movement of the main heater. As mentioned earlier, in the field of the single crystal pulling method, there is also a known method in which the position of the quartz crucible is maintained constant and the main heater is lowered in an interlocked manner based on computer calculations to match the decrease in the height of the surface of the silicon melt. The present invention aims for a thermal balance of the silicon melt by providing a mechanism which moves the subheater relative to the quartz crucible in an interlocked manner with the main heater.

In this invention, since the subheater can move up and down as mentioned earlier, there are following advantages over when the subheater is a fixed type. That is, when the quartz crucible or the main heater is moved during the pulling of the single crystal, if the subheater is a fixed type, then the relative spatial relationship of the subheater with the quartz crucible or the main heater changes and extremely sophisticated control is required to achieve the primary absolute goal, which is to maintain the temperature of the solid-liquid interface at the solidifying temperature.

That is, radiation heat transfer is dominant in a heating system and temperature control of the solid-liquid interface is carried out as follows: the radiation heat transfer form factors of the main heater, the quartz crucible and the subheater when they are in the prescribed relative positions are calculated; based on these form factors, heat transfer calculations are carried out to maintain a constant temperature at the solid-liquid interface; and output control of the main heater and the subheater is conducted based on the results of the calculations. Therefore, if the spatial relationship between the main heater or the quartz crucible and the subheater changes, then new heat transfer calculations are necessary to maintain a constant solid-liquid interface temperature, resulting in extremely sophisticated control.

However, in the present invention, since the spatial relationship between the main heater or the quartz crucible and the subheater is always maintained constant, it is not necessary to repeat the heat transfer calculations, making the control very easy.

As shown clearly thus far, according to the present invention, it is possible to maintain the thermal environment of the semiconductor melt in the quartz crucible without doing sophisticated control and obtain a homogeneous semiconductor single crystal by using a single crystal pulling apparatus which pulls a semiconductor single crystal rod from a semiconductor melt contained in a quartz crucible to grow the semiconductor single crystal wherein said quartz crucible can move up and down so as to maintain the level of said semiconductor melt constant and a main heater which can move up and down and a subheater which can move up and down are provided to heat said semiconductor melt so that the thermal environment of said semiconductor melt is maintained constant.

EMBODIMENT

An embodiment of the present invention is described below by referring to the attached drawings.

FIG. 1 is a vertical sectional view which shows an embodiment of the single crystal pulling apparatus of the present invention. In this figure, in the center of a chamber 1 which has an air-tight tank shape, a hollow support axis 2 comes vertically from below and vertically stacked two support mounts 3 and 4 are installed on the top of support axis 2. Placed on top of support mount 3 are a quartz crucible 5 and a graphite crucible 6 which surrounds and protects said quartz crucible 5. Quartz crucible 5 and graphite crucible 6 are designed such that they can be moved up and down by driving support axis 2 in the direction of the axis.

In chamber 1, a cylindrical main heater 7 is placed around the side of quartz crucible 5 and graphite crucible 6, and also a heat insulating cylinder 8 is placed around main heater 7. Electrodes 9 are placed on the bottom of main heater 7 to make up-and-down motions possible.

Also, in chamber 1, a disc shaped subheater 10 is placed under crucible 5 and graphite crucible 6. Electrodes 11 are placed on the bottom of subheater 10 to make up-and-down motions possible.

A cooling water pathway (not shown) is provided in the surrounding wall of chamber 1. The wall surface of chamber 1 is cooled by pumping cooling water through this.

Next, a process for growing a silicon single crystal using said single crystal pulling apparatus is described. The polycrystalline silicon raw material put into quartz crucible 5 is heated and melted by main heater 7 and subheater 10, and quartz crucible 5 is filled with a silicon melt 13. A seed crystal 15, hung from above, is then dipped in silicon melt 13, and seed crystal 15 is pulled at a prescribed rate while being rotated to grow a desired silicon single crystal rod 14 on the tip of seed crystal 15.

Figure 2:
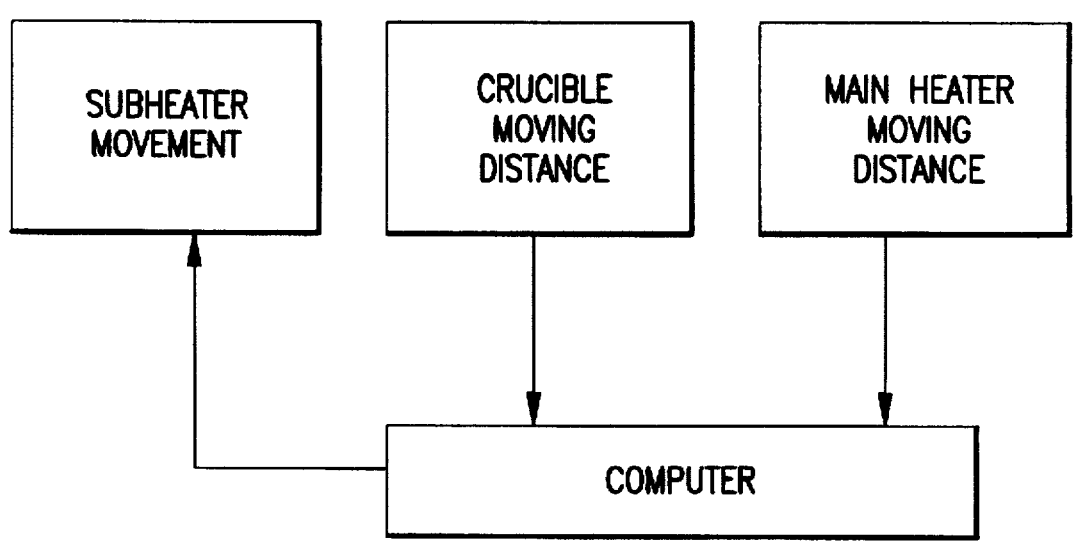
FIG. 2 is a block diagram which shows a control method of the up-and-down motions of the subheater.

As the pulled weight of the silicon single crystal increases, the volume of silicon melt 13 decreases and therefore the relative position of the surface of silicon melt 13 to main heater 7 changes gradually. In order to correct for the variations in temperature at the interface between the silicon single crystal and the silicon melt from the solidifying temperature due to this change, crucible 5 and graphite crucible 6 are raised by the desired distance or main heater 7 is lowered by the desired distance based on calculations interlocked with the weight of the single crystal. As shown in FIG. 2, when crucible 5 and graphite crucible 6 are raised by the computer, subheater 10 is raised in an interlocked manner by the same distance. When main heater 7 is lowered, subheater 10 is lowered in an interlocked manner by the same distance.

EXAMPLES

Next, an example of growing a silicon single crystal rod by pulling it using said single crystal pulling apparatus is shown.

First, 210 kg of the polycrystalline silicon raw material was put into quartz crucible 5, and heated and melted by main heater 7 to obtain silicon melt 13 in quartz crucible 5. A seed crystal, hung from above, was then dipped in this silicon melt 13, and said seed crystal was pulled upwardly at a prescribed rate while being rotated to grow a single crystal with a diameter of 300 mm at the tip of the seed crystal.

As the pulled weight of the silicon single crystal increased, the volume of the silicon melt decreased and therefore the relative position of the surface of silicon melt to main heater 7 changed gradually. In order to maintain the temperature at the interface between the single crystal and the melt at the solidifying temperature, crucible 5 and graphite crucible 6 were raised by the desired distance based on calculations interlocked with the weight of the single crystal. Also, subheater 10 was raised by the same distance in an interlocked manner with crucible 5 and graphite crucible 6. The silicon single crystal rod thus pulled had a diameter tolerance within 300±5 mm, resulting in a silicon single crystal rod with a high precision.

What is claimed is:

1. A single crystal pulling apparatus, comprising:

a quartz crucible for containing a semiconductor melt from which a semiconductor single crystal rod is pulled to grow a semiconductor single crystal;

a main heater for heating said semiconductor melt through said quartz crucible; and a subheater for additionally heating said semiconductor melt through said quartz crucible;

wherein said quartz crucible can move up and down so as to maintain the level of said semiconductor melt constant; and said main heater and said subheater can move up and down according to the motion of said quartz crucible so that the thermal environment of said semiconductor melt is maintained substantially constant.

2. The single crystal pulling apparatus of claim 1 wherein the up-and-down motion of said subheater is interlocked to the up-and-down motion of said quartz crucible or the up-and-down motion of said main heater.

3. A single crystal pulling apparatus, comprising:

a quartz crucible for containing a semiconductor melt from which a semiconductor single crystal rod is pulled to grow a semiconductor single crystal;

a main heater for heating said semiconductor melt through said quartz crucible;

a subheater for additionally heating said semiconductor melt through said quartz crucible; and a computer for controlling moving of said subheater;

wherein said quartz crucible can move up and down so as to maintain the level of said semiconductor melt constant;

said main heater can move up and down according to the motion of said quartz crucible; and said subheater can move up and down in an interlocked manner as said main heater and said quartz crucible move up and down according to the moving distances of said main heater and said quartz crucible by inputting data of the moving distances of said crucible moving distance and said main heater into said computer and controlling the moving of said subheater thereby so as to maintain said subheater at the suitable position where the thermal environment of said semiconductor melt is maintained substantially constant.

* * * * *